United States Patent [19]
Rountree

[11] Patent Number: 5,808,482
[45] Date of Patent: *Sep. 15, 1998

[54] ROW DECODER WITH LEVEL TRANSLATOR

[75] Inventor: Robert N. Rountree, Plano, Tex.

[73] Assignee: Texas Instruments Incorporated, Dallas, Tex.

[*] Notice: The term of this patent shall not extend beyond the expiration date of Pat. No. 5,668,485.

[21] Appl. No.: 816,860

[22] Filed: Mar. 13, 1997

Related U.S. Application Data

[63] Continuation of Ser. No. 652,232, Dec. 20, 1994, Pat. No. 5,668,485, which is a continuation of Ser. No. 138,603, Oct. 18, 1993, which is a continuation of Ser. No. 886,618, May 21, 1992.

[51] Int. Cl.$^6$ .......................... H03K 19/0185; G11C 8/00
[52] U.S. Cl. ........................ 326/108; 326/81; 365/230.06
[58] Field of Search ................................... 326/105–106, 326/108, 80–81, 68, 83; 365/189.09, 189.11, 230.06, 230.08

[56] References Cited

U.S. PATENT DOCUMENTS

| | | | |
|---|---|---|---|
| 4,442,481 | 4/1984 | Brahmbhatt | 326/106 |
| 4,527,079 | 7/1985 | Thompson | 326/78 |
| 4,574,273 | 3/1986 | Atsumi | 326/81 |
| 4,649,521 | 3/1987 | Tsuchida et al. | 365/230.06 |
| 4,656,373 | 4/1987 | Plus | 326/81 |
| 4,730,132 | 3/1988 | Watanabe et al. | 326/84 |
| 4,798,977 | 1/1989 | Sakui et al. | 326/108 |
| 5,039,882 | 8/1991 | Arakawa | 326/106 |
| 5,051,959 | 9/1991 | Nakano et al. | 326/108 |
| 5,166,554 | 11/1992 | Reddy et al. | 326/108 |
| 5,202,855 | 4/1993 | Morton | 365/189.11 |
| 5,214,602 | 5/1993 | Lines | 365/189.11 |
| 5,241,511 | 8/1993 | Hsueh | 365/230.06 |
| 5,265,052 | 11/1993 | D'Arrigo et al. | 365/189.09 |
| 5,335,205 | 8/1994 | Ogihara | 365/230.06 |
| 5,668,485 | 9/1997 | Rountree | 326/81 |

Primary Examiner—Jon Santamauro
Attorney, Agent, or Firm—Robert N. Rountree; J. Fred Telecky; Richard L. Donaldson

[57] ABSTRACT

A combined row decoder and level translator powered by an on-chip high voltage supply results in an efficient layout, area savings and elimination of the global precharge signal resulting in additional area and power savings. In addition, power from the high voltage supply is consumed only by the level translator and wordline driver of the selected decoder resulting in additional power savings.

43 Claims, 3 Drawing Sheets

1

ROW DECODER WITH LEVEL TRANSLATOR

This is a continuation of application Ser. No. 08/652,232, filed Dec. 20, 1994 now U.S. Pat. No. 5,668,485; which is a continuation of application Ser. No. 08/138,603, filed Oct. 18, 1998; which is a continuation of application Ser. No. 07/886,618, filed May 21, 1992.

FIELD OF THE INVENTION

The present invention relates to the field of integrated circuit devices. More specifically, the present invention relates to a row decoder with level translator.

BACKGROUND OF THE INVENTION

Integrated circuits formed using complementary-metal-oxide-semiconductor (CMOS) processes for memory applications frequently use row and column decode circuits to address unique memory cells in the memory array. The output of the row decode circuit is often referred to as a wordline, and the output of the column decode circuit may be referred to as a bitline or column select line. Decoder size and complexity are principal design considerations, since it must fit the pitch of the memory cell. Additionally, the number of active control signals and address or factor lines required for each memory access may significantly affect power consumption of the integrated circuit due to the large number of decode circuits required for a typical memory array.

Trends toward faster access times and low voltage operation have led to the development of on-chip high voltage supplies for various circuit applications. This method eliminates the circuit delay and overvoltage penalty of conventional bootstrapping techniques. One particular application of the on-chip high voltage supply is in the row decoder where it is frequently necessary to elevate the wordline above the external supply potential. However, previous designs have been complicated by complex precharge schemes and level translation schemes which consume power and layout area. What is needed is a simple and compact row decoder for low power operation.

SUMMARY OF THE INVENTION

The present invention disclosed herein comprises a row decoder having excellent time and power requirements. One embodiment of the row decoder is comprised of a combined first decode and level translation stage which is selectively connected to a wordline driver by means of a second decode stage. In another embodiment of the present invention, a first decode stage is selectively connected to a combined level translator and wordline driver by means of a second decode stage.

DETAILED DESCRIPTION OF PREFERRED EMBODIMENTS

Figure 1:
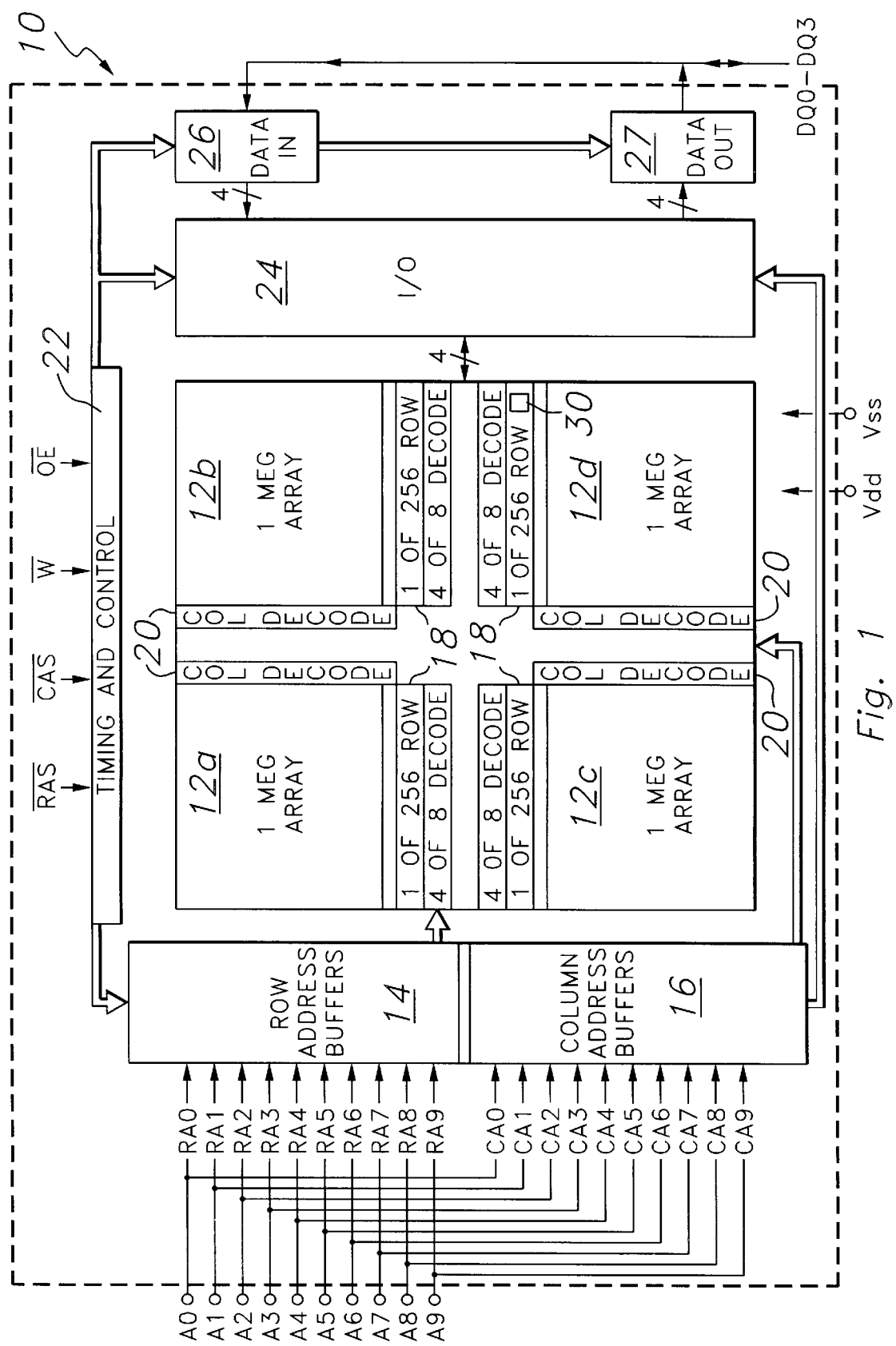
FIG. 1 is a block diagram of a memory device which may employ the row decoder of the present invention.

The block diagram of FIG. 1 illustrates a semiconductor memory device with which the invention may be practiced. Exemplar device 10 is a Dynamic Random Access Memory (DRAM) of the so-called 4 megabit (MB) density. According to a preferred architecture, the device is partitioned into four identical logical data blocks 12, individually designated 12a, 12b, 12c and 12d. Each block 12 is of the one megabit size, comprising 1,048,576 memory cells arranged in an array of rows and columns.

Device 10 includes input buffers (row address buffers 14 and column address buffers 16) connected to address inputs (A0–A9 in a 1M×4 DRAM or A0–A10 in a 4M×1 DRAM), row decoders 18 and column decoders 20, timing and control circuitry 22 and Input/Output circuitry 24. Timing and control circuitry 22 is also connected to Input/Output 24 and Data In 26. Input/Output 24 is also connected to Data In 26 and Data Out 28. The operation is controlled by RAS_, CAS_, W_ and OE_ on input pins. Power is supplied by Vdd and Vss terminals.

In a preferred embodiment of the invention, device 10 includes compact row decoders with level translators 30 (one shown) within row decoders 18.

Figure 2:
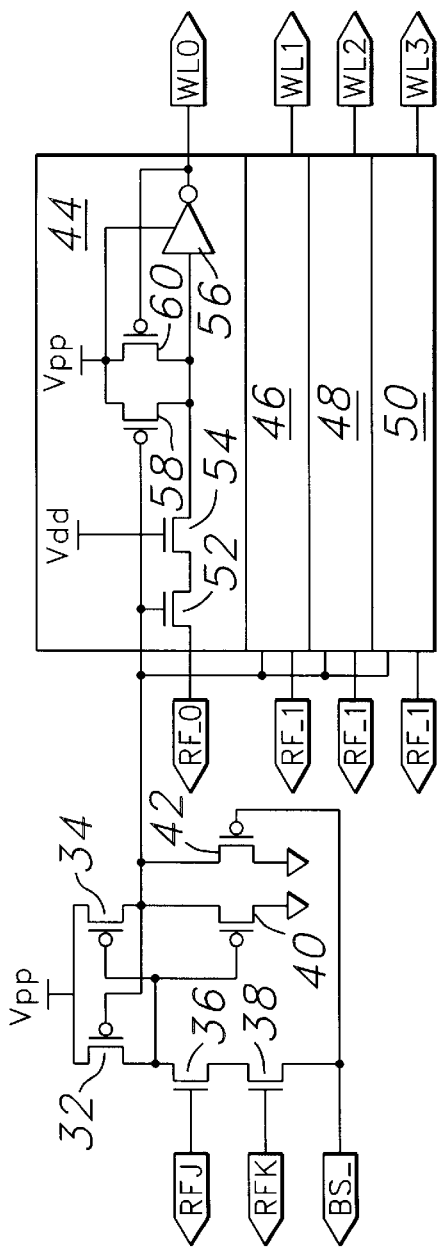
FIG. 2 is a schematic diagram of a row decoder according to one embodiment of the present invention.

Referring now to FIG. 2, there is illustrated a schematic diagram of a preferred embodiment of the present invention. The first stage decoder and level translator is comprised of cross-coupled P-channel transistors 32 and 34 having a common source connected to a high voltage reference supply, typically Vpp, decoding N-channel transistors 36 and 38 and deselecting N-channel transistors 40 and 42. Series connected decoder transistors 36 and 38, having gates connected to row factor inputs RFJ and RFK respectively, serve to connect the drain of transistor 32 and common gates of transistors 34 and 40 to block select input BS_. The output of the first stage decoder and level translator is formed by the common drains of transistors 34, 40 and 42 and the gate terminal of transistor 32. Each of subcircuits 44, 46, 48 and 50 is a combined second stage decoder and wordline driver with a unique row factor input and wordline output. (Subcircuits 44–50 are identical with only the schematic diagram of subcircuit 44 being shown for illustrative purposes.) Input RF_0 of subcircuit 44, for example, is connected to the source of N-channel transistor 52. The gate is connected to the first stage output and the drain is connected by means of N-channel transistor 54 to the input of inverting wordline driver 56. The gate of transistor 54 is connected to a reference supply, typically Vdd. The first stage output is also connected to the common gate terminal of transistor 58 having a source connected to a reference supply, typically Vpp, and drain connected to the input of the inverting wordline driver. The source and drain of P-channel transistor 60 is connected in parallel with transistor 58 with gate connected to wordline WL0 from the inverting wordline driver.

In operation, the decoder is selected when RFJ and RFK both go high, typically Vdd, and BS_ goes low so that transistor 42 is off. Due to the ratio with transistor 32, transistors 36 and 38 discharge the common gate of transistors 34 and 40 and the said output goes high, typically Vpp, two gate delays after first stage row factors RFJ and RFK and turns off transistor 32. Also, transistor 58 is turned off and transistor 52 is turned on. One of the second stage row factors, for example RF_0, goes low to turn on transistor 54. Due to the ratio with transistor 60, the input of inverting wordline driver 56 goes low and WL0 goes high, typically Vpp, after a single gate delay thereby turning off transistor 60. The inputs of unselected inverting wordline drivers remain latched high so that their respective wordlines remain low.

The decoder is reset to an unselected state when BS__ goes high, typically Vdd. This reduces the gate-source potential of transistor 34, turns transistor 38 off and transistor 42 on so that the said output terminal is discharged. As a result, transistor 32 restores the common gate of transistors 34 and 40 to a high level, typically Vpp, transistor 52 is turned off and transistor 58 is turned on. Transistor 58 charges the input of the previously selected inverting wordline driver and wordline WL0 goes low. As a result, power from the high voltage supply is consumed only by the level translator and wordline driver of the selected decoder and no precharge signal is necessary. This is a significant improvement over existing circuits.

Figure 3:
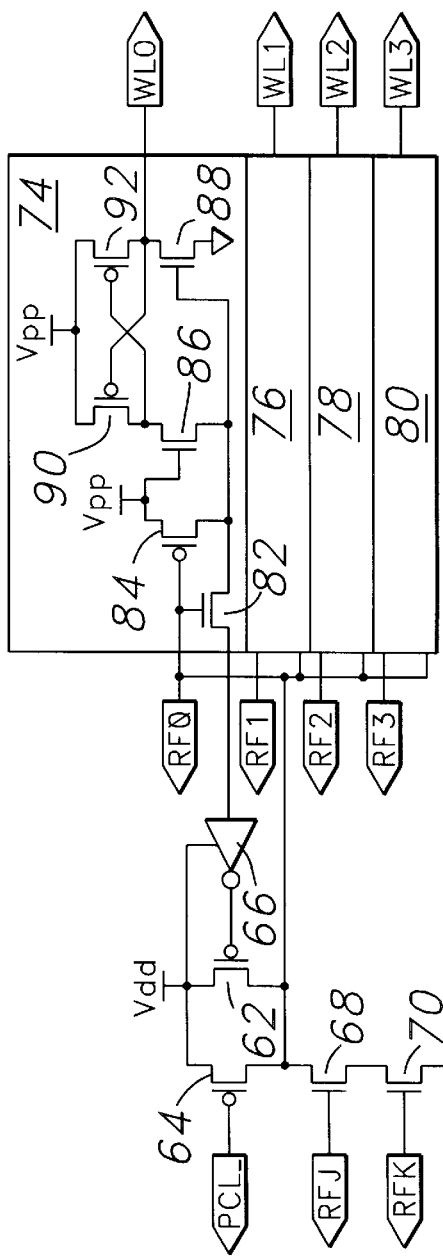
FIG. 3 is a schematic diagram of a row decoder according to another embodiment of the present invention.

Referring now to FIG. 3, there is illustrated a schematic diagram of another embodiment of the present invention. The first stage decoder is comprised of P-channel transistors 62 and 64 having a common source connected to a reference supply, typically Vdd, and having a common drain output, inverter 66 and series-connected N-channel transistors 68, 70 and 72. The gate of transistor 64 is connected to precharge signal PCL__. The gate of transistor 62 is connected to inverter 66 which is connected to the said output node to form a latch circuit. Transistors 68, 70 and 72 are connected to row factor inputs RFJ and RFK and block select signal BS respectively. Each of subcircuits 74, 76, 78 and 80 is a combined second stage decoder and level translating wordline driver with a unique row factor input and wordline output. (Subcircuits 74–80 are identical with only the schematic diagram of subcircuit 74 being shown for illustrative purposes.) Input RF0 of subcircuit 74, for example, is connected to the gate of N-channel transistor 82 and P-channel transistor 84. The common drain of transistors 84 and 82 is connected to the input of the combined level translator and wordline driver formed by the source of N-channel transistor 86 and the gate of N-channel drive transistor 88. These share drains with cross-coupled P-channel transistors 90 and 92 respectively having a common source connected to a high voltage reference supply, typically Vpp. The common source and gate of transistors 84 and 86 is connected to a reference supply, typically Vdd.

In operation, precharge signal PCL__ is high so transistor 64 is off and the decoder is selected when RFJ, RFK and BS go high, typically Vdd. Due to the ratio with transistor 62, transistors 68, 70 and 72 discharge the first stage output in a single gate delay and transistor 62 is turned off by inverter 66. One of the second stage row factors, for example RF0, goes high to turn off transistor 84 and turn on transistor 82 discharging the gate and thereby turning off transistor 88. Due to the ratio with transistor 90, the gate of transistor 92 is also discharged through transistor 86 so that wordline WL0 goes high, typically Vpp, a single gate delay after the first stage output goes low. Either unselected first or second stage row decoders, will cause the input of the said combined level translators and wordline drivers to remain high and the corresponding wordline to remain low.

The decoder is reset to an unselected state when row factors, BS and PCL__ go low precharging the first stage output high, typically Vdd. This resets the latch formed by inverter 66 and transistor 62 and resets the selected combined level translator and wordline driver. Therefore, only a single precharge signal powered by the low voltage supply is required for precharge. Power from the high voltage supply is consumed only by the selected combined level translator and wordline driver.

Figure 4:
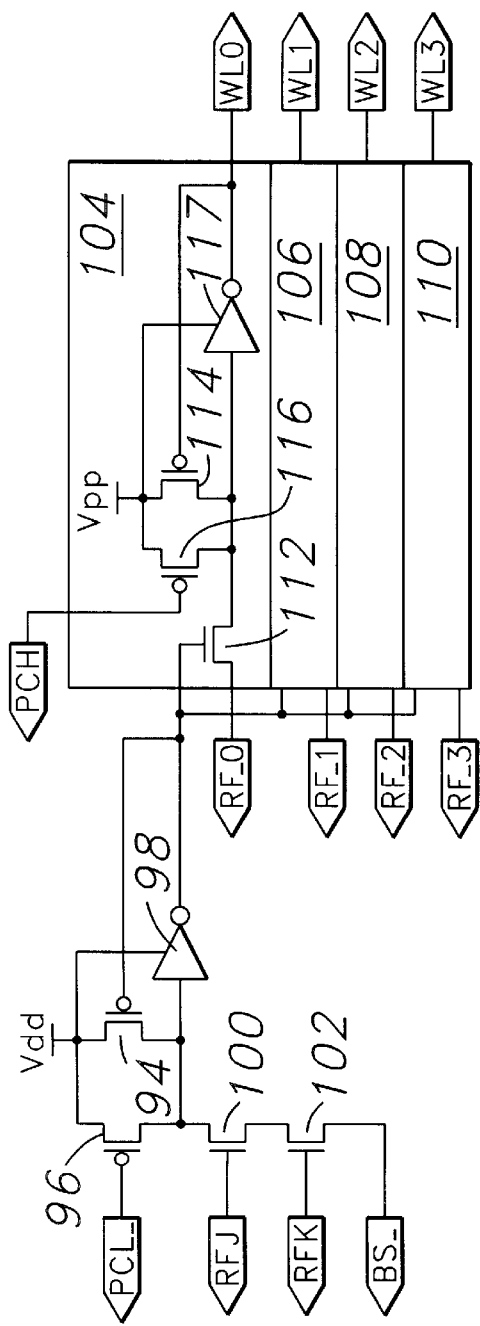
FIG. 4 is a schematic diagram of a row decoder circuit of prior art.

Referring now to FIG. 4, there is illustrated a known row decoder with first stage decoder comprising P-channel transistors 94 and 96 having a common source connected to a reference supply, typically Vdd, and having a common drain with the input of inverter 98 and series-connected N-channel transistors 100 and 102. The gate of transistor 96 is connected to precharge signal PCL__. The gate of transistor 94 is connected to the output of inverter 98 to form a latch circuit. Transistor 100 is connected to row factor input RFJ and transistor 102 is connected to row factor input RFK and block select signal BS__. Each of subcircuits 104, 106, 108 and 110 is a combined second stage decoder and inverting wordline driver with a unique row factor input and wordline output. (Subcircuits 104–110 are identical with only the schematic diagram of subcircuit 104 being shown for illustrative purposes.) Input RF 0 of subcircuit 104, for example, is connected to the source of N-channel transistor 112 with gate terminal connected to the first stage output. P-channel transistors 114 and 116 have a common drain with transistor 112 that is connected to the input of inverting wordline driver 117. The common source of transistors 114 and 116 is connected to a high voltage reference supply. The gate of transistor 116 is connected to high voltage precharge signal PCH. The gate of transistor 114 is connected to WL0, the output of inverting wordline driver 117, to form a latch.

In operation, precharge signal PCL__ is high so transistor 96 is off and the decoder is selected when RFJ and RFK go high, typically Vdd, and BS__ goes low. Due to the ratio with transistor 94, transistors 100 and 102 discharge the input of inverter 98 causing the first stage output to go high after one gate delay so that transistor 94 is turned off. One of the second stage row factors, for example $RF_{13}$ 0, goes low to turn on transistor 112. Precharge transistor 116 is off and, due to the ratio with transistor 114, the input of inverting wordline driver 117 goes low and WL0 goes high after a single gate delay thereby turning off transistor 114. The inputs of unselected inverting wordline drivers remain latched high so that their respective wordlines remain low.

The decoder is reset to an unselected state when BS__ foes high and row factors and $PCL_{13}$ go low precharging the input of inverter 98 high, typically Vdd. This resets the latch formed by inverter 98 and transistor 94 and turns off transistor 112. Additionally, second stage row factor RF__ goes high and high voltage precharge signal PCH goes low to charge the input of the previously selected inverting wordline driver and wordline WL0 goes low.

Therefore, a precharge signal powered by the low voltage supply is required to precharge the first stage decoder. Power from the high voltage supply is consumed by the selected inverting wordline driver as well as precharge signal PCH which is connected to transistors of each second stage decoder of a substantial number of row decoders.

Figure 5:
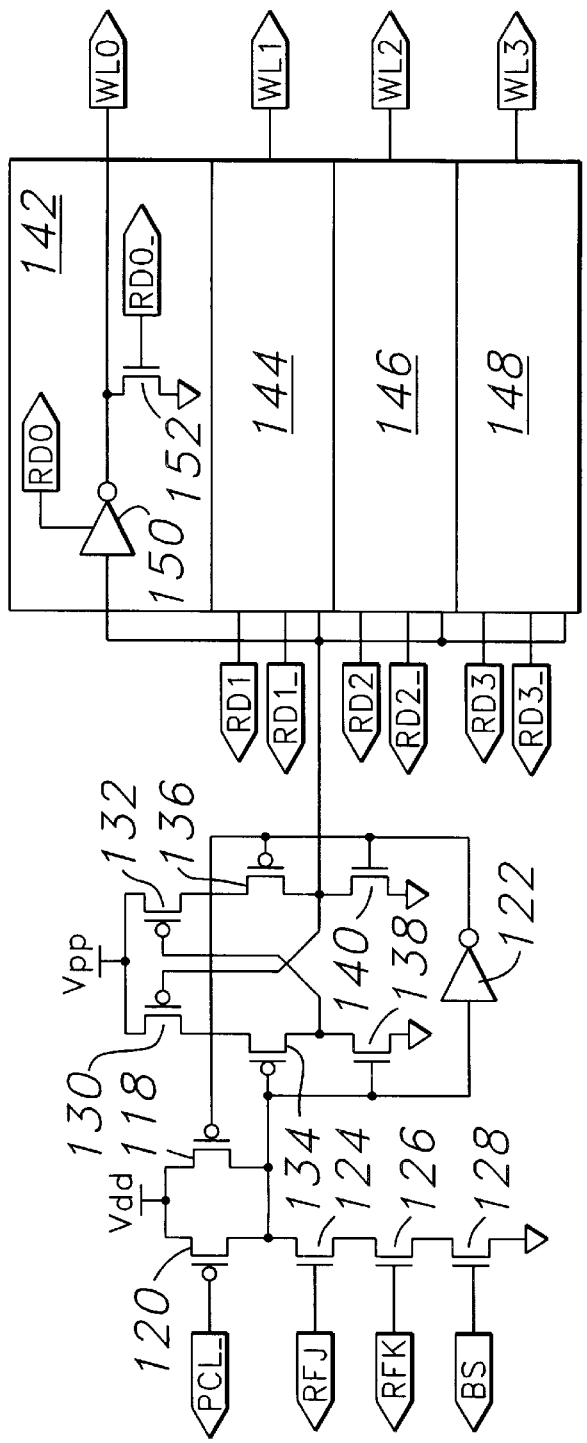
FIG. 5 is a schematic diagram of another row decoder circuit of prior art.

Referring now to FIG. 5, there is illustrated another known row decoder with first stage decoder comprising P-channel transistors 118 and 120 having a common source connected to a reference supply, typically Vdd, and having a common drain output connected to the input of inverter 122 and series-connected N-channel transistors 124, 126 and 128. The gate of transistor 120 is connected to precharge signal PCL__. The gate of transistor 118 is connected to inverter 122 which is connected to the first stage output node to form a latch circuit. Transistors 124, 126 and 128 are connected to row factor inputs RFJ and RFK and block select signal BS. The first stage output and its complement from inverter 122 serve as inputs for a level translator comprised of P-channel transistors 130, 132, 134 and 136 and N-channel transistors 138 and 140. The common drain of transistors 136 and 140 forms the level translator output which is connected to the inverting wordline driver of each of subcircuits 142, 144, 146 and 148. (Subcircuits 142–148 are identical with only the schematic diagram of subcircuit 142 being shown for illustrative purposes.) Input RD0 of subcircuit 142, for example, powers inverting wordline driver 150. Complementary RD0_ is connected the gate of N-channel transistor 152.

In operation, precharge signal PCL_ is high so transistor 120 is off and the decoder is selected when RFJ, RFK and BS go high, typically Vdd. Due to the ratio with transistor 118, transistors 124, 126 and 128 discharge the first stage output after one gate delay and transistor 118 is turned off by inverter 122. Additionally, the first stage output and its complement from inverter 122 turn off transistors 136 and 138 and turn on transistors 134 and 140 causing the gate of transistor 130 to go low. When both 130 and 134 are on, the common drain of transistors 134 and 138 goes high, typically Vpp, and turns off transistor 132, and the level translator output at the common drain of transistors 136 and 140 goes low. One of the second stage predecoder outputs, for example RD0, goes high, typically Vpp, and powers inverting wordline driver 150 causing output WL0 to go high after one gate delay. N-channel transistor 152 and complementary predecoder input RD0_ are necessary to actively hold unselected wordlines of selected first stage decoders low.

The decoder is reset to an unselected state when row factors, BS and PCL$_{13}$ go low precharging the first stage output high, typically Vdd. This resets the latch formed by inverter 122 and transistor 118 and resets the level translator so that the common drain output of transistors 136 and 140 is high, typically Vpp. Additionally, selected predecoder inputs RD0 and RD0_ are reset and WL0 goes low.

Therefore, a precharge signal powered by the low voltage supply is required to precharge the first stage decoder. Power from the high voltage supply is consumed by the selected inverting wordline driver as well as predecoder signal RD0 which is connected to second stage decoders of a substantial number of row decoders.

While this invention has been described with reference to an illustrative embodiment, this description is not to be construed in a limiting sense. For example, while the row decoder and level translator has been described in conjunction with a 4M DRAM, the decoder may be used in other DRAMs, EEPROMs, other memory devices or non-memory devices. Indeed, it is ideally suited for situations where there is a need to drive a high voltage line. Various modifications to the illustrative embodiment, as well as other embodiments of the invention will be apparent to persons skilled in the art upon reference to this description. It is therefore contemplated that the appended claims will cover any such modifications or embodiments as fall within the true scope of the invention.

What is claimed:

1. A decoder circuit for a semiconductor device, comprising:
    a plurality of decoding transistors having current paths connected in series to a first output terminal, a control terminal of each decoding transistor coupled to receive a respective address signal of a first voltage range from a first group of address signals for producing a first output signal at the first output terminal;
    a plurality of select transistors coupled to the first output terminal, each select transistor coupled to receive a respective address signal from a second group of address signals; and
    a drive circuit corresponding to each select transistor, the drive circuit comprising:
        a first drive transistor having a control terminal coupled to a respective select transistor and a current path coupled between a drive voltage terminal and a second output terminal;
        a second drive transistor having a control terminal coupled to the second output terminal and a current path coupled between the drive voltage terminal and the respective select transistor; and
        a third drive transistor having a current path coupled between the current path of the second drive transistor and the respective select transistor, the third drive transistor having a conductivity type that is opposite a conductivity type of the second drive transistor.

2. A decoder circuit as in claim 1 wherein the current paths of the plurality of decoding transistors are further connected in series to a select signal, the select signal operative for selecting the decoder circuit.

3. A decoder circuit as in claim 1 wherein the first voltage range is 0–$V_{DD}$.

4. A decoder circuit as in claim 1 wherein the first output signal has a second voltage range at the first output terminal, the second voltage range having a magnitude greater than the first voltage range.

5. A decoder circuit as in claim 1 wherein the first output signal has two states, a first state produced by the plurality of decoder transistors and a second state produced by a first output transistor having a current path connected between a voltage supply terminal and the first output terminal.

6. A decoder circuit as in claim 1 wherein a second output signal at the second output terminal has a second voltage range, the second voltage range having a magnitude greater than a magnitude of the first voltage range.

7. A decoder circuit as in claim 6 further comprising a fourth drive transistor having a current path coupled between the second output terminal and a reference voltage terminal, the fourth drive transistor having a conductivity type that is the same as the conductivity type of the third drive transistor.

8. A decoder circuit as in claim 7 wherein the second output signal has a magnitude equal to the magnitude of a voltage between the drive voltage terminal and the reference voltage terminal.

9. A decoder circuit as in claim 8 wherein the second output terminal is coupled to a wordline of a memory array.

10. A decoder circuit as in claim 9 wherein the memory array is a dynamic random access memory array.

11. A circuit for a semiconductor device, comprising:
    a decoder circuit including a plurality of decoding transistors having current paths connected in series to a first output terminal, a control terminal of each decoding transistor coupled to receive a respective address signal of a first voltage range from a first group of address signals for producing a first output signal at the first output terminal without receiving a precharge signal from a source external to the decoder circuit, the plurality of decoding transistors conducting current only during a transition of the first output signal; and
    a plurality of select transistors, each select transistor having a current path coupled to the first output terminal, each select transistor coupled to receive a respective address signal from a second group of address signals.

12. A circuit as in claim 11 further comprising a plurality of drive circuits, each drive circuit having an input terminal and a second output terminal, each input terminal coupled to a respective one of the select transistors for selectively producing a second output signal at the second output terminal.

13. A circuit as in claim 12 wherein the second output signal has a second voltage range, the second voltage range having a magnitude greater than a magnitude of the first voltage range.

14. A circuit as in claim 13 wherein each of the second output terminals is coupled to a respective wordline of a memory array.

15. A circuit as in claim 14 wherein the current paths of the plurality of decoding transistors are further connected in series to a select signal, the select signal operative for selecting the decoder circuit.

16. A circuit as in claim 14 wherein the memory array is a dynamic random access memory array.

17. A circuit as in claim 14 wherein each address signal of the second group of address signals has the first voltage range.

18. A circuit as in claim 17 wherein each drive circuit further comprises:
   a first output transistor having a control terminal coupled to the input terminal and a current path connected between a voltage supply terminal and the second output terminal for producing a second output signal; and
   a second output transistor having a control terminal coupled to receive the second output signal and a current path connected between the voltage supply terminal and the first output terminal.

19. A circuit as in claim 18 wherein the drive circuit produces the second output signal without receiving a precharge signal from a source external to the drive circuit.

20. A circuit for a semiconductor device, comprising:
   a decoder circuit including a plurality of decoding transistors having current paths connected in series to a first output terminal, a control terminal of each decoding transistor coupled to receive a respective address signal of a first voltage range from a first group of address signals for producing a first output signal at the first output terminal without receiving a precharge signal from a source external to the decoder circuit, the plurality of decoding transistors conducting current only during a transition of the first output signal; and
   a plurality of select transistors, each select transistor having a control terminal coupled to the first output terminal, each select transistor having a current path coupled to receive a respective address signal of the first voltage range from a second group of address signals.

21. A circuit as in claim 20 further comprising a plurality of drive circuits, each drive circuit having an input terminal and a second output terminal, each input terminal coupled to a respective one of the select transistors for selectively producing a second output signal at the second output terminal.

22. A circuit as in claim 21 wherein the second output signal has a second voltage range, the second voltage range having a magnitude greater than a magnitude of the first voltage range.

23. A circuit as in claim 22 wherein each of the second output terminals is coupled to a respective wordline of a memory array.

24. A circuit as in claim 23 wherein the current paths of the plurality of decoding transistors are further connected in series to a select signal, the select signal operative for selecting the decoder circuit.

25. A circuit as in claim 23 wherein the memory array is a dynamic random access memory array.

26. A circuit as in claim 23 wherein each drive circuit further comprises:
   a first output transistor having a control terminal coupled to the input terminal and a current path connected between a voltage supply terminal and the second output terminal for producing a second output signal; and
   a second output transistor having a control terminal coupled to receive the second output signal and a current path connected between the voltage supply terminal and the first output terminal.

27. A circuit as in claim 26 wherein the drive circuit produces the second output signal without receiving a precharge signal from a source external to the drive circuit.

28. A circuit, comprising:
   a decoder circuit including a plurality of decoding transistors having control terminals and current paths, the current paths connected in series to a first output terminal, each control terminal coupled to receive a respective first address signal of a first voltage range for producing a first output signal at the first output terminal without receiving a precharge signal from a source external to the decoder circuit, the plurality of decoding transistors conducting current only during a transition of the first output signal;
   a plurality of select transistors, each select transistor coupled to the first output terminal, each select transistor receiving a respective second address signal, the respective second address signal having the first voltage range; and
   a plurality of drive circuits, each drive circuit coupled between a voltage supply terminal and a reference terminal, each drive circuit having an input terminal coupled to a respective select transistor, each drive circuit producing a second output signal at a second output terminal, responsive to the first output signal and the respective second address signal, the second output signal having a second voltage range.

29. A circuit as in claim 28, wherein the circuit is a dynamic random access memory circuit.

30. A circuit as in claim 29, wherein the first output signal has the first voltage range.

31. A circuit as in claim 30, wherein the first output terminal is coupled to a current path of each select transistor.

32. A circuit as in claim 30, wherein the first output terminal is coupled to a control terminal of each select transistor.

33. A circuit as in claim 30, further comprising a feedback transistor having a control terminal and a current path, the control terminal coupled for receiving the second output signal, the current path coupled between the voltage supply terminal and the input terminal.

34. A circuit as in claim 33, wherein each second output terminal is coupled to a respective word line of the dynamic random access memory circuit.

35. A circuit as in claim 34, wherein the drive circuit produces the second output signal without receiving a precharge signal from a source external to the drive circuit.

36. A circuit as in claim 29, wherein the first output signal has the second voltage range.

37. A circuit as in claim 36, wherein the control gate of each select transistor is coupled to receive the first output signal.

38. A circuit as in claim 37, further comprising a feedback transistor having a control terminal and a current path, the control terminal coupled for receiving the second output signal, the current path coupled between the voltage supply terminal and the input terminal.

39. A circuit as in claim 38, wherein each second output terminal is coupled to a respective word line of the dynamic random access memory circuit.

40. A circuit as in claim 39, wherein the drive circuit produces the second output signal without receiving a precharge signal from a source external to the circuit.

41. A circuit as in claim 29, wherein the current path of each select transistor is coupled to the input terminal of each respective drive circuit.

42. A circuit as in claim 41, wherein a current path of each select transistor is coupled to receive the respective second address signal.

43. A circuit as in claim 41, wherein a control terminal path of each select transistor is coupled to receive the respective second address signal.

* * * * *